(12) United States Patent
French et al.

(10) Patent No.: US 8,207,578 B2
(45) Date of Patent: Jun. 26, 2012

(54) METHOD OF FORMING A REGION OF GRADED DOPING CONCENTRATION IN A SEMICONDUCTOR DEVICE AND RELATED APPARATUS

(75) Inventors: William French, San Jose, CA (US); Erika Mazotti, San Martin, CA (US); Yuri Mirgorodski, Sunnyvale, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 13/156,184

(22) Filed: Jun. 8, 2011

(65) Prior Publication Data

US 2011/0233670 A1    Sep. 29, 2011

Related U.S. Application Data

(62) Division of application No. 12/589,417, filed on Oct. 23, 2009, now Pat. No. 7,964,485.

(51) Int. Cl.
*H01L 29/78* (2006.01)

(52) U.S. Cl. ............................... 257/335; 257/E29.256

(58) Field of Classification Search .................. 257/355, 257/E29.256
See application file for complete search history.

(56) References Cited

U.S. PATENT DOCUMENTS

| | | | |
|---|---|---|---|
| 4,927,772 A * | 5/1990 | Arthur et al. ................ | 438/140 |
| 5,077,227 A | 12/1991 | Kameyama et al. | |
| 5,300,448 A | 4/1994 | Merchant et al. | |
| 5,538,917 A | 7/1996 | Kunitou | |
| 5,888,880 A | 3/1999 | Gardner et al. | |

(Continued)

FOREIGN PATENT DOCUMENTS

JP    362200731 A    9/1987

OTHER PUBLICATIONS

Sorab K. Ghandhi, "VLSI Fabrication Principles, Silicon and Gallium Arsenide", Second Edition, 1994, 5 pages.
Lee James Jacobson, et al., "Method for Dopant Profile Tuning Using Sub-Micron Horizontal Tip Feature", U.S. Appl. No. 11/179,059, filed Jul. 11, 2005.
Stengl et al., "Variation of Lateral Doping—A New Concept to Avoid High Voltage Breakdown of Planar Junctions", International Device Meeting, 1985, p. 154-157.

*Primary Examiner* — Zandra Smith
*Assistant Examiner* — Paul Patton
(74) *Attorney, Agent, or Firm* — Wade J. Brady, III; Frederick J. Telecky, Jr.

(57) ABSTRACT

A method for forming a doped region of a semiconductor device includes masking a portion of a substrate with a mask. The mask is configured to create a graded doping profile within the doped region. The method also includes performing an implant using the mask to create doped areas and undoped areas in the substrate. The method further includes diffusing the doped areas to create the graded doping profile in the doped region. The mask could include a first region having openings distributed throughout a photo-resist material, where the openings vary in size and spacing. The mask could also include a second region having blocks of photo-resist material distributed throughout an open region, where the photo-resist blocks vary in size and spacing. Diffusing the doped areas could include applying a high temperature anneal to smooth the doped and undoped areas to produce a linearly graded doping profile.

20 Claims, 5 Drawing Sheets

U.S. PATENT DOCUMENTS

| | | |
|---|---|---|
| 6,023,090 A | 2/2000 | Letavic et al. |
| 6,071,793 A | 6/2000 | Peidous et al. |
| 6,271,575 B1 | 8/2001 | Peidous |
| 7,175,777 B1 | 2/2007 | Labonte et al. |
| 7,495,347 B2 * | 2/2009 | Raisanen et al. .............. 257/797 |
| 2002/0076920 A1 | 6/2002 | Kim |
| 2002/0175144 A1 | 11/2002 | Hung et al. |
| 2003/0003647 A1 | 1/2003 | Dennison et al. |
| 2004/0184703 A1 | 9/2004 | Bakir et al. |
| 2010/0001344 A1 * | 1/2010 | Stefanov et al. .............. 257/339 |

* cited by examiner

METHOD OF FORMING A REGION OF GRADED DOPING CONCENTRATION IN A SEMICONDUCTOR DEVICE AND RELATED APPARATUS

This application is a divisional of prior U.S. patent application Ser. No. 12/589,417 filed on Oct. 23, 2009, now U.S. Pat. No. 7,964,485.

TECHNICAL FIELD

This disclosure relates generally to semiconductor devices and, more specifically, to a method of forming a region of a graded doping concentration in a semiconductor device and related apparatus.

BACKGROUND

High voltage Metal Oxide Semiconductor (MOS) transistors often rely upon a drift region that extends from a drain contact to a channel of a Field Effect Transistor (FET). The drift region typically has a much lower impurity concentration then an adjacent drain area, and the drift region connects the transistor's gate region with the adjacent drain area. The sustaining breakdown voltage of a MOS transistor often depends greatly on the concentration of the impurity in the drift region.

BRIEF DESCRIPTION OF THE DRAWINGS

For a more complete understanding of the this disclosure and its advantages, reference is now made to the following description, taken in conjunction with the accompanying drawings, in which.

DETAILED DESCRIPTION OF THE INVENTION

FIGS. 1 through 8, discussed below, and the various embodiments used to describe the principles of the present invention in this patent document are by way of illustration only and should not be construed in any way to limit the scope of the disclosure. Those skilled in the art will understand that the principles of the present disclosure may be implemented in any suitably arranged device or system.

Figure 1:
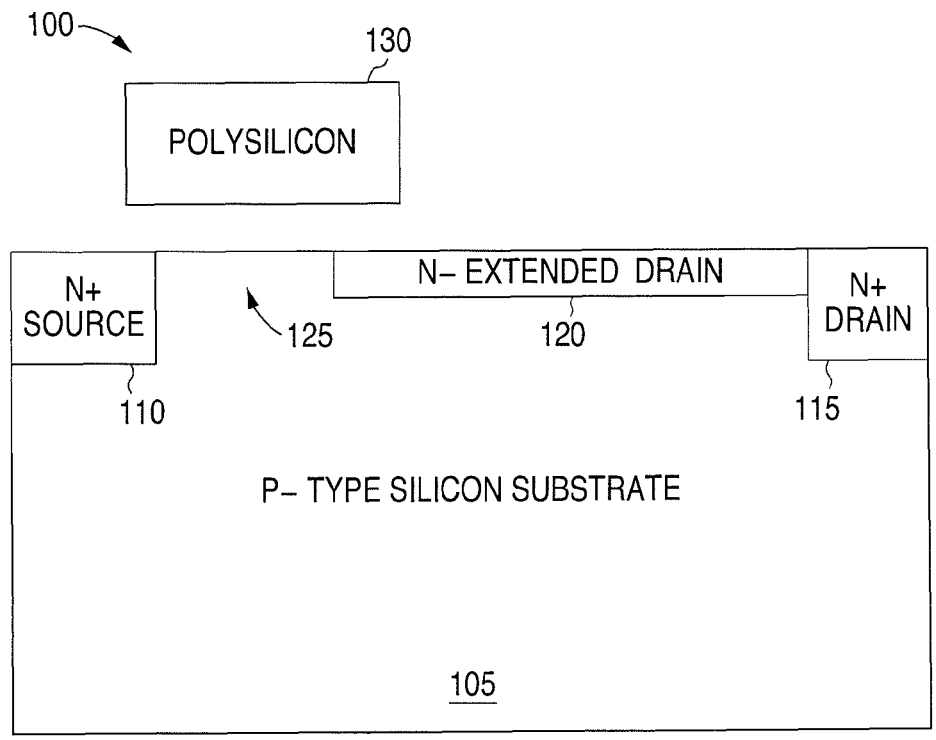
FIG. 1 illustrates a basic structure of an extended drain Metal Oxide Semiconductor (MOS) transistor according to this disclosure.

FIG. 1 illustrates a basic structure of an extended drain Metal Oxide Semiconductor (MOS) transistor according to this disclosure. The embodiment of the transistor 100 shown in FIG. 1 is for illustration only. Other embodiments of the transistor 100 could be used without departing from the scope of this disclosure.

As shown in FIG. 1, the transistor 100 includes a P-type silicon substrate 105, an N+ source region 110, an N+ drain region 115, and a drift region 120 that forms an N− extended drain. The drift region 120 is used to drop voltage between the drain 115 and a channel 125. The transistor 100 also includes a gate 130, formed here by polysilicon. When a voltage is applied to the drain 115, a depletion region is formed at the N−/P junction, which is where a breakdown of the transistor 100 can occur.

The drift region 120 is doped to alter the properties within the drift region 120. Doping is the process of intentionally introducing impurities into an extremely pure (also referred to as intrinsic) semiconductor to change its electrical properties. The impurities are dependent upon the type of semiconductor. A semiconductor can be doped to such high levels that it acts as a conductor. Accordingly, a maximum voltage rating of the transistor 100 is often dependent upon the doping in the drift region 120, as well as a length of the drift region 120. As described in more detail below, various techniques can be used to form a graded doping profile in the drift region 120.

Figure 2:
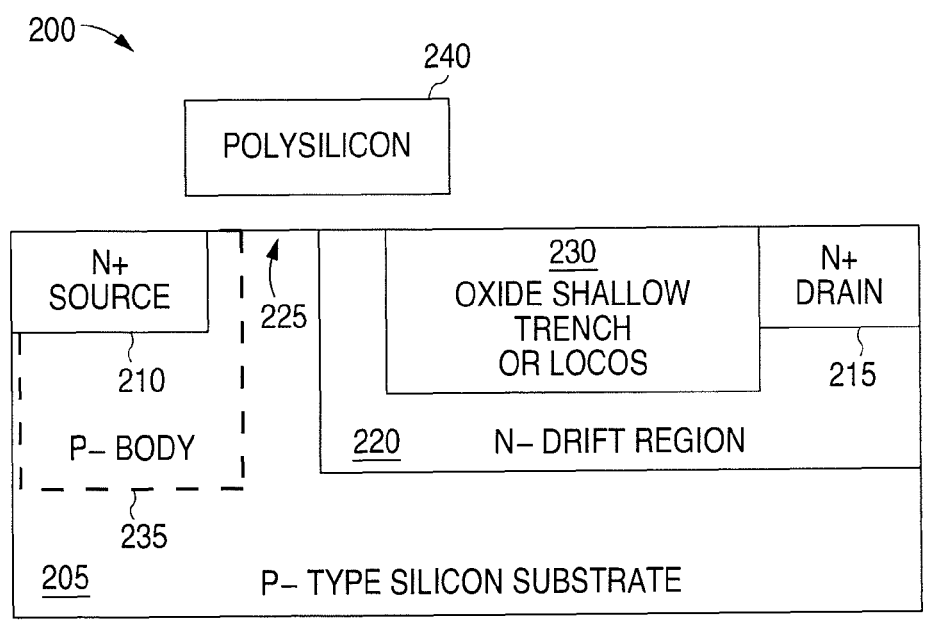
FIG. 2 illustrates a basic structure of a field oxide Laterally Diffused MOS transistor according to this disclosure.

FIG. 2 illustrates a basic structure of a field oxide Laterally Diffused MOS (LDMOS) transistor 200 according to this disclosure. The embodiment of the LDMOS transistor 200 shown in FIG. 2 is for illustration only. Other embodiments of the transistor 200 could be used without departing from the scope of this disclosure.

As shown in FIG. 2, the LDMOS transistor 200 includes a P-type silicon substrate 205, an N+ source region 210, an N+ drain region 215, an N− drift region 220, and an oxide shallow trench or Local Oxidation Isolation Structure (LOCOS) 230. The N+ source 210 here is formed within a P− body 235, and the transistor 200 also includes a gate 240. The drift region 220 is used to drop voltage between the drain 215 and a channel 225. When a voltage is applied to the drain 215, a depletion region is formed at the N−/P junction, which is where a breakdown of the LDMOS transistor 200 can occur.

The drift region 220 is doped to alter the properties within the drift region 220. Accordingly, a maximum voltage rating of the LDMOS transistor 200 is often dependent upon the doping in the drift region 220, as well as a length of the drift region 220. As described in more detail below, various techniques can be used to form a graded doping profile in the drift region 220.

Figure 3:
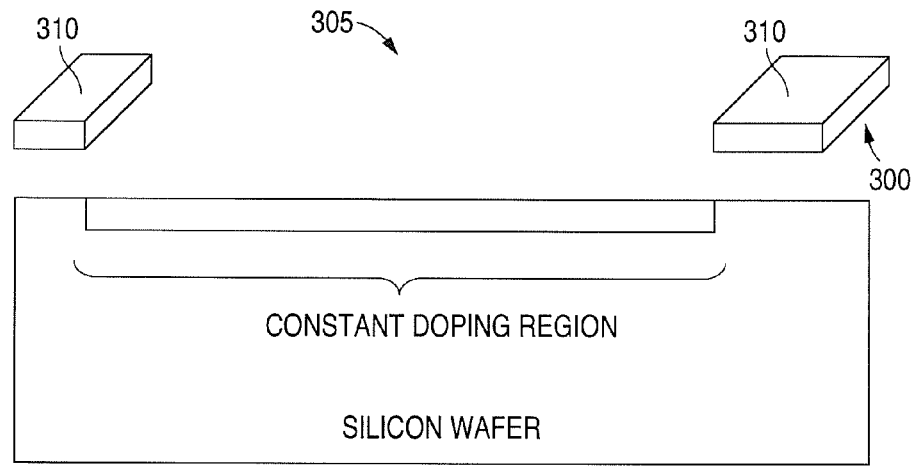
FIG. 3 illustrates a single-opening mask according to this disclosure.

FIG. 3 illustrates a single-opening mask 300 according to this disclosure. In this example, doping in an N− or other region (such as the drift region 120 or 220 in FIG. 1 or 2) is created by a single implant with a single opening in the mask 300. The mask 300 includes photo-resist portions 310 that surround and define the boundaries of a via 305 (an opening) that exposes a region of a substrate to a doping process. A doping implant applied through the via 305 creates a generally constant or even doping in the exposed portion of the substrate.

Figure 4:
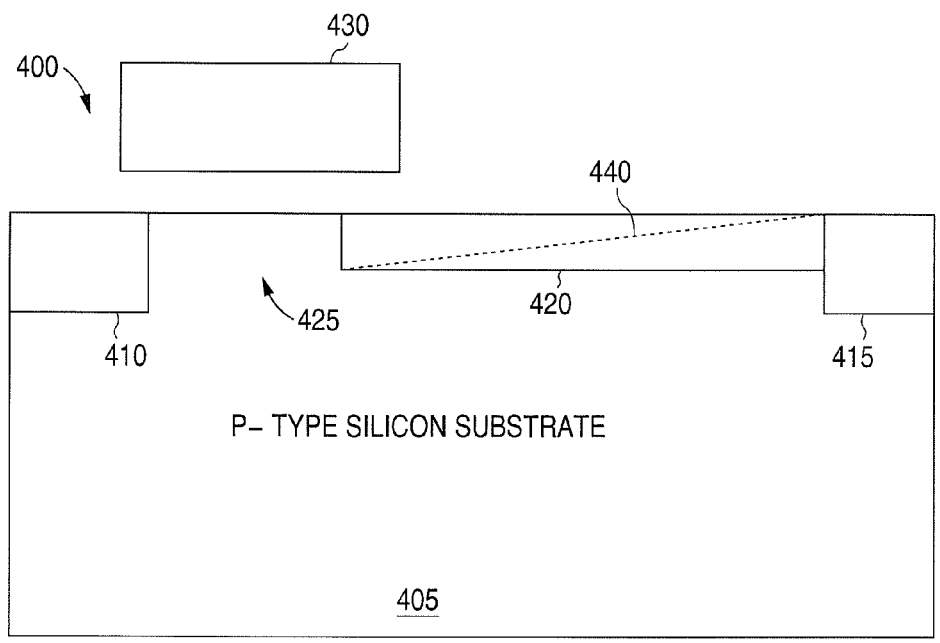
FIG. 4 illustrates a structure having a linearly graded doping concentration across a drift region according to this disclosure.

FIG. 4 illustrates a structure 400 having a linearly graded doping concentration across a drift region according to this disclosure. The embodiment of the structure 400 shown in FIG. 4 is for illustration only. Other embodiments of the structure 400 could be used without departing from the scope of this disclosure.

As shown in FIG. 4, the structure 400 includes a substrate 405, a source region 410, a drain region 415, and a linearly graded drift region 420. FIG. 4 further illustrates a graphical representation of the doping concentration in the drift region 420. A doping line 440 illustrates that a doping concentration level is low near a channel region 425 and highest near the drain region 415. A gate 430 is positioned above the channel region 425.

The drift region 420 here is used to drop voltage between the drain 415 and the channel 425. The drift region 420 is doped in a graduated manner (doped unevenly or doped via a linear gradient) to alter the properties within the drift region 420. When a voltage is applied to the drain 415, a depletion region is formed at an N−/P junction. Accordingly, a maximum voltage rating of the structure 400 is often dependent upon the gradient doping in the drift region 420, as well as a length of the drift region 420.

Figure 5:
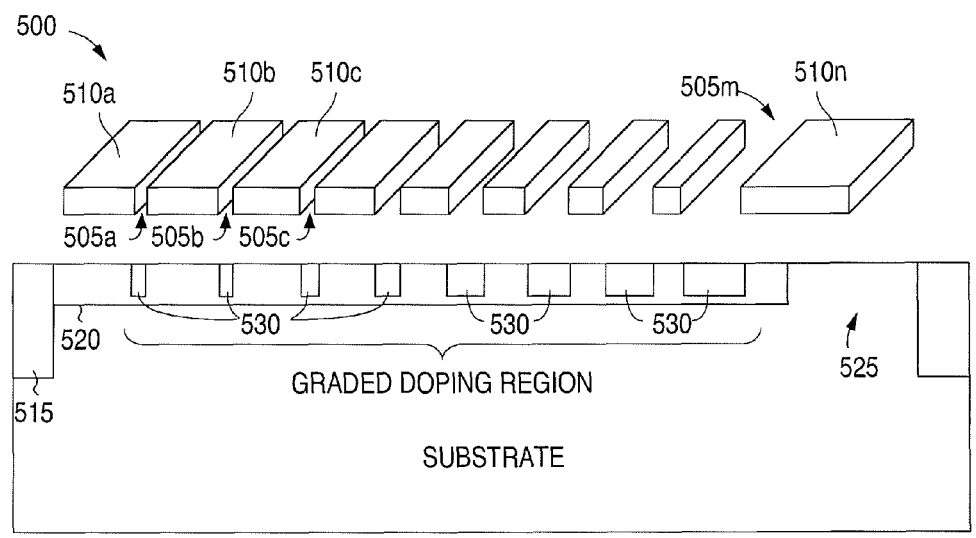
FIG. 5 illustrates a gradient mask for forming a graded doping profile according to this disclosure.

FIG. 5 illustrates a gradient mask 500 for forming a graded doping profile according to this disclosure. The embodiment of the gradient mask 500 shown in FIG. 5 is for illustration only. Other embodiments of the gradient mask 500 could be used without departing from the scope of this disclosure.

In some embodiments, doping in the drift region 420 of FIG. 4 or other doped region can be created by the mask 500. The mask 500 includes photo-resist portions 510a-510n with openings (vias) 505a-505m disposed between the photo-resist portions 510a-510n. At least some (and possibly all) of the photo-resist portions 510a-510n can vary in width and/or spacing. In this example, a first photo-resist portion 510a is wider than a second photo-resist portion 510b, which is wider than a third photo-resist portion 510c and so forth. Additionally, the vias 505a-505m between the photo-resist portions 510a-510n are defined by the spacings between the photo-resist portions 510a-510n, and the vias 505a-505m can also vary in dimension. In this example, a first via 505a is smaller than a second via 505b, which is smaller than a third via 505c and so forth.

Here, the vias 505a-505m expose a region of a substrate from a drain 515 to a channel 525 to a doping process. Since the varied spacing of the photo-resist portions 510a-510n form the varied sized vias 505a-505m, the vias 505a-505m can be used to create a graded doping in a drift region 520. The resultant series of doped regions 530 (i.e., doped blocks) can then be subjected to a long, high temperature anneal or other process, whereby the doped regions 530 are blurred together to form a more linear doping profile for the drift region (such as the profile illustrated in FIG. 4).

Figure 6:
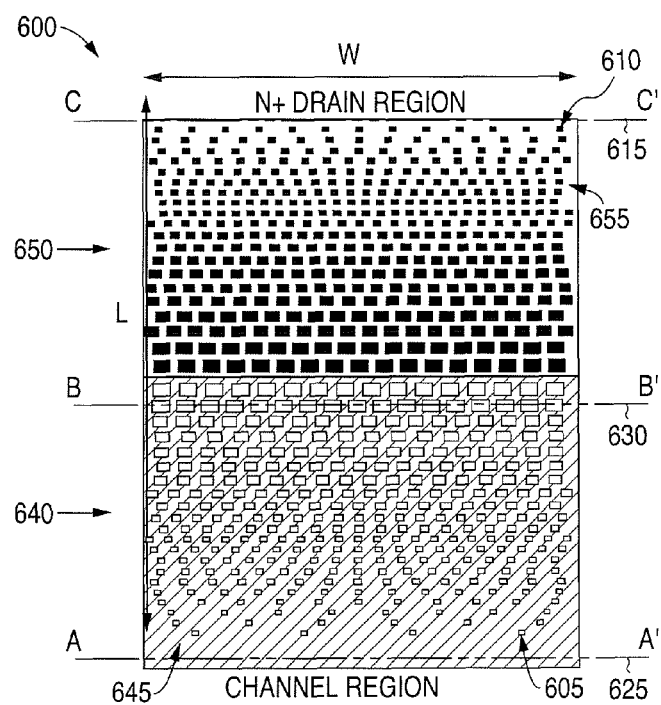
FIG. 6 illustrates a density-based drift mask for forming a graded doping profile according to this disclosure.

FIG. 6 illustrates a density-based drift mask for forming a graded doping profile according to this disclosure. The embodiment of the density-based drift mask 600 shown in FIG. 6 is for illustration only. Other embodiments of the mask 600 could be used without departing from the scope of this disclosure.

In some embodiments, an extended drift structure can be formed using the mask 600. Here, the shape of the mask 600 is such that the size and shape of photo-resist portions 610 and vias 605 (formed by spaces between or in the photo-resist portions 610) vary in two dimensions. The shape of the mask 600, the implant dose, and the time and temperature of a thermal anneal can be interlinked to form a final desired profile in the doping concentration of a structure, such as the concentration of N-type phosphorus in an extended drift structure.

As shown in FIG. 6, the mask 600 includes a varying density of blocks of photo-resist portions 610 with vias 605 (i.e., openings) disposed between or in the varying-density photo-resist portions 610. The photo-resist portions 610 (and corresponding vias 605) are distributed in two-dimensions across the mask 600. The photo-resist portions 610 can be square, hexagonal, octagonal, or any other shape. The width and spacing of the photo-resist portions 610 in an area of the mask 600 can be used to control the density of the mask 600.

The mask density is defined as the average area of photo-resist material to the total area for a given space (such as a square micron). This density factor can be varied linearly between a channel region (such as channel 425 in FIG. 4) and a drain contact (such as drain region 415 in FIG. 4).

The mask 600 includes two distinct portions in FIG. 6. The lower portion generally includes a single layer of photo-resist material with openings formed within the photo-resist material. The upper portion generally includes isolated photo-resist portions separated by open spaces. The varying density of photo-resist portions 610 are configured to gradually dope a drift region or other area in the "L" direction such that the doping can be low at the edge nearest a channel region and high near a drain region. A line A-A' 625 represents a P-N junction between the channel region and a drift region. A line C-C' 615 represents the junction between the drift region and the drain region.

A line B-B' 630 marks an example transition region where the drift mask 600 transitions from the lower portion (with substantial portions of photo-resist having multiple openings dispersed therein) to the upper portion (with a substantial opening having a plurality of photo-resist portions 610 dispersed therein). Between lines 625-630, the mask 600 has a first mask region 640 containing a region of photo-resist 645. The first mask region 640 includes a number of openings (vias) 605 that are small and widely spaced in the photo-resist 645. The openings (vias) 605 increase in number and size and reduce in dispersion proceeding along a length of the mask 600 from line 625 to line 630.

Additionally, a pattern can be formed by the configuration of openings 605 and can be repeated across a width of the mask 600. For example, proceeding lengthwise from line 625 to line 630, the number of openings 605 across a width of the mask 600 can include from four evenly spaced openings 605 to six evenly spaced openings 605 to eight evenly spaced openings 605 and so on. Near the middle of the mask 600, the openings 605 are large and closely spaced such that a higher doping concentration results at line 630 than at line 625. The openings 605 may or may not be spaced evenly throughout each section. Further, the openings 605 in each section may or may not align with the openings 605 in other sections.

Near the drain contact at line 615, the photo-resist portions 610 are configured into a second mask region 650. The second mask region 650 includes a number of photo-resist portions 610 that are small and widely spaced in an open region 655 (e.g., openings 605 can between each of the photo-resist portions 610). This allows most of an implanted dopant to appear in the underlying substrate and can provide maximum doping concentration in the drift region or other doped region being formed.

In some embodiments, the openings 605 can form the large open region 655 that includes the number of photo-resist portions 610. The photo-resist portions 610 increase in number and size and reduce in dispersion proceeding along the length of the mask 600 from line 615 to line 630. Additionally, a pattern formed by the configuration of photo-resist portions 610 can be repeated across the width of the mask 600. In this example, starting at line 615 and moving downward, the number of photo-resist portions increases from thirteen evenly spaced photo-resist portions to fifteen evenly spaced photo-resist portions to seventeen evenly spaced photo-resist portions and so on. The photo-resist blocks 610 may or may not be spaced evenly throughout each section. Near the middle of the mask 600, the photo-resist portions 610 are large and closely spaced such that a lower doping concentration results at line 630 than at line 615. Further, the photo-resist portions 610 in each section may or may not align with the photo-resist portions 610 in other sections.

In some embodiments, in an area substantially in the middle of the mask 600 at line 630, the pattern of photo-resist portions 610 and openings 605 can be reversed. On a first side of the line 630, openings 605 are distributed through a region of photo-resist 645. On a second side of the line 630, the photo-resist portions 610 are distributed throughout an open region 655. For example, on the first side of the line 630, the photo-resist portions 610 can be configured such that the single photo-resist region 645 is formed, and the openings 605 can be distributed throughout the photo-resist 645 in the first mask region 640 proceeding from small and widely spaced openings 605 near line 625 to large and closely spaced openings 605 near line 630. On the second side of the line 630, the openings 605 can be configured such that the single opening region 655 is formed, and the photo-resist portions 610 can be distributed throughout the open region 655 proceeding from small and widely spaced photo-resist portions 610 near line 615 to large and closely spaced photo-resist portions 610 near line 630.

The mask 600 can be applied to a silicon wafer or any other suitable semiconductor substrate. Thereafter, an implant dopant (such as a phosphorus implant dopant) is applied to the substrate. The implant can be subjected to a high temperature anneal (such as at 1175° C. for 100 minutes) or other process to smooth the dopant distribution into a generally uniform concentrations across the width of the mask 600 and into gradually increasing concentrations along the length of the mask 600.

Figure 7:
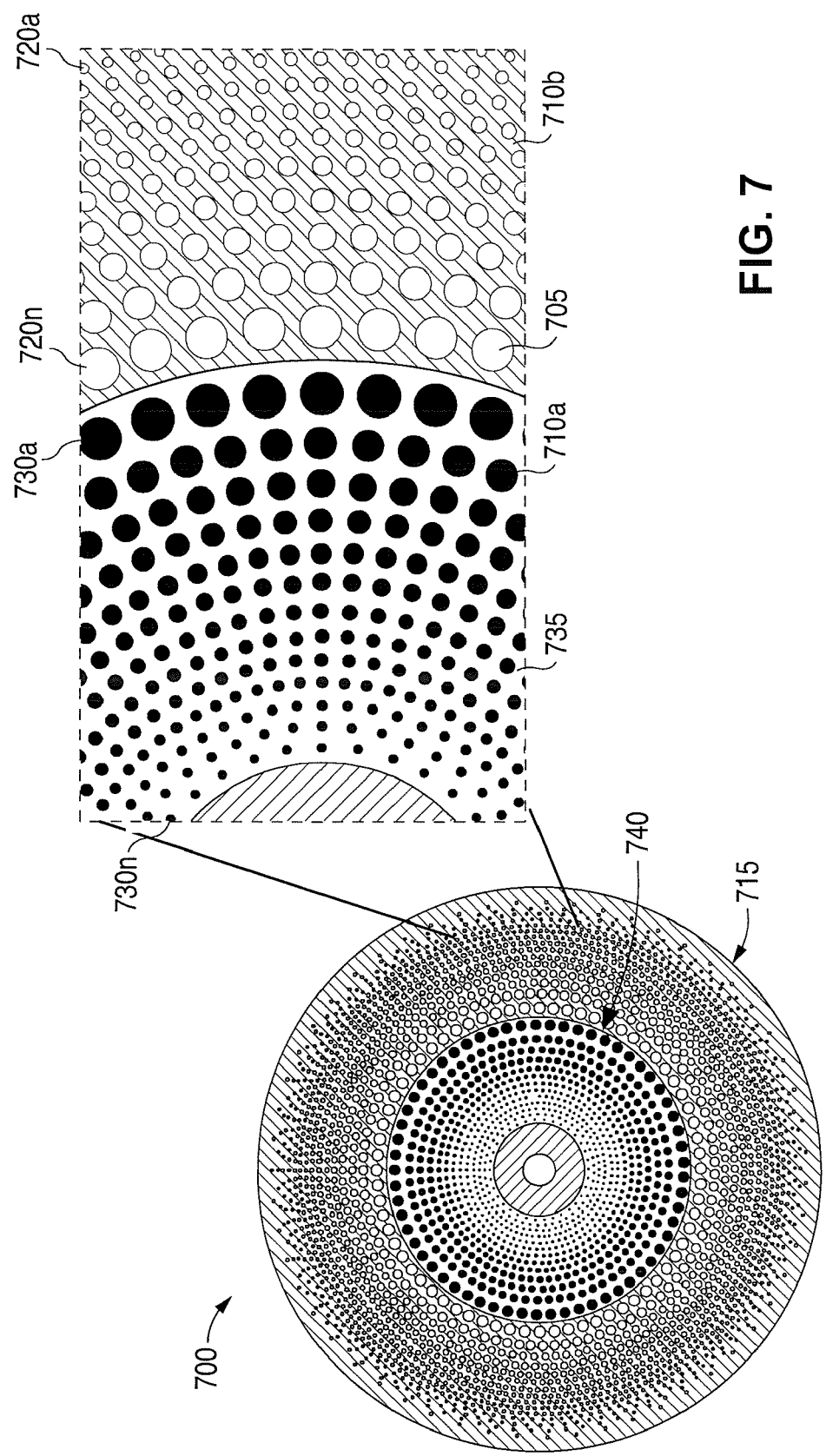
FIG. 7 illustrates a circular drift mask for forming a graded doping profile according to this disclosure.

FIG. 7 illustrates a circular drift mask 700 for forming a graded doping profile according to embodiments of the present disclosure. The embodiment of the circular drift mask 700 shown in FIG. 7 is for illustration only. Other embodiments of the mask 700 could be used without departing from the scope of this disclosure.

In some embodiments, a circular or annular layout is used for the design of a transistor or other device. The transistor or other device can include an N– drift region or other region with a graded density.

As shown in FIG. 7, the mask 700 is configured in a circular or annular configuration. The mask 700 can include a number of openings 705 interspersed throughout a photo-resist 710. The photo-resist 710 can include a number of photo-resist blocks 710 and/or a photo-resist area 710b.

In this example, the mask 700 includes a first ring region 715 disposed proximate an outermost edge of the mask 700. The first ring region 715 includes a number of ring sections 720a-720n. Each ring section 720a-720n includes a number of openings 705 distributed though-out photo-resist 710b. The openings 705 can be any shape including, but not limited to, circular, octagonal, hexagonal, square, and triangular. Further, the openings 705 vary from small and widely spaced openings 705 in a first ring section 720a proximate to the outermost edge of the mask 700 to large and closely spaced openings 705 in an inner ring section 720n disposed nearest to a second ring region 740.

The second ring region 740 includes a number of ring sections 730a-730n. Each ring section 730a-730n includes an open region 735 with a number of photo-resist blocks 710a distributed throughout the open region 735. The photo-resist blocks 710a can be any shape including, but not limited to, circular, octagonal, hexagonal, square, and triangular. Further, the photo-resist blocks 710a vary from large and closely spaced photo-resist blocks 710a in a first ring section 730a proximate the outermost edge of the second ring region 740 to small and widely spaced photo-resist blocks 710a in an inner subsequent ring section 730n disposed nearest to the center-most portion of the mask 700.

The number of openings 705 in a ring section 730a-730n may or may not be different than the number of openings 705 in other ring sections 730. Additionally, the number of photo-resist blocks 710a in a ring section 720a-720n may or may not be different than the number of photo-resist blocks 710a in other ring sections 720. Furthermore, a pattern of respective openings 705 and/or photo-resist blocks 710a can be repeated in one or more ring sections. In some embodiments, respective openings 705 in one or more ring sections 730a-730n can align with respective openings 705 in one or more additional ring sections 730a-730n. Also, in some embodiments, respective photo-resist blocks 710a in one or more ring sections 720a-720n can align with respective photo-resist blocks 710a in one or more additional ring sections 720a-720n.

The mask 700 can be applied to a silicon wafer or other substrate. Thereafter, an implant dopant (such as a phosphorus implant dopant) is applied to the substrate. The implant can be subjected to a high temperature anneal (such as 1175° C. for 100 minutes) or other process to smooth the dopant distribution into gradually increasing concentrations radially from the center of the mask 700.

Figure 8:
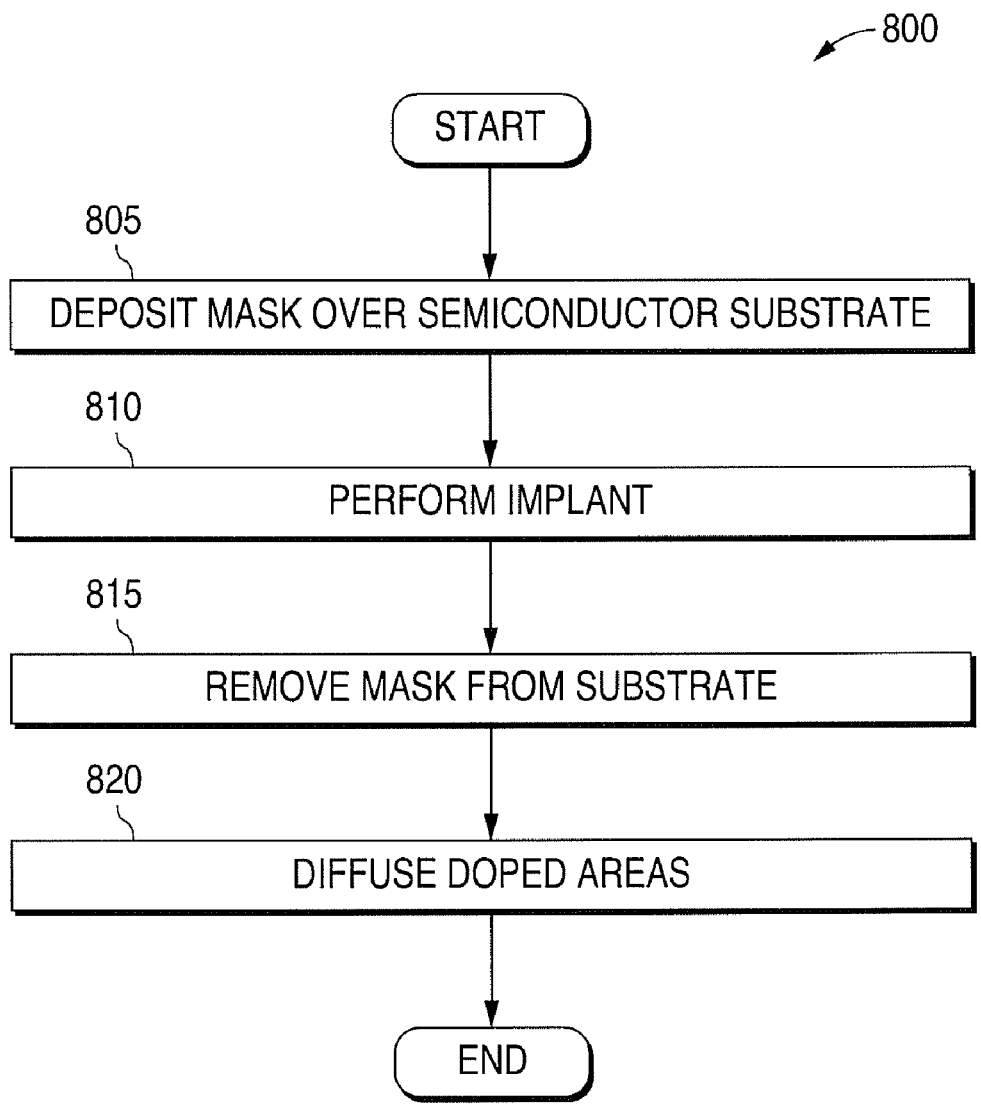
FIG. 8 illustrates a process for forming a semiconductor device having a region with graded doping concentration according to this disclosure.

FIG. 8 illustrates a process for forming a semiconductor device having a region with graded doping concentration according to this disclosure. The embodiment of the process 800 shown in FIG. 8 is for illustration only. Other embodiments of the process 800 could be used without departing from the scope of this disclosure.

Starting with a semiconductor substrate, such as a P-type silicon substrate, a mask is deposited onto the semiconductor substrate at step 805. This could include, for example, depositing a layer of photo-resist material and patterning the photo-resist material. The mask can be a linearly graded masking layer applied to portions of the semiconductor substrate. The mask includes a varying density of photo-resist blocks and openings. The density of photo-resist blocks and openings can vary in size and spacing in multiple dimensions across the mask. One of more of the photo-resist blocks can be square, hexagonal, octagonal or any other shape. Additionally, one or more of the openings can be square, hexagonal, octagonal or any other shape. The width and spacing of these photo-resist blocks and openings can be used to control a density of the mask. The density can be varied linearly between a channel region of the semiconductor device and a drain contact of the semiconductor device.

At step 810, an implant (such as a phosphorus implant) is performed at a specified energy and dose. The implant can be performed over the mask to create a drift region or other doped region having areas of doped and undoped substrate material. After that, the mask can be removed at step 815, such as by stripping the photo-resist material off the substrate.

The doped areas are diffused at step 820. This could include, for example, performing a long, high temperature anneal to diffuse the dopant. Subjecting the dopant to a high temperature anneal or other process can smooth out the dopant distribution to create a desired doping profile. During this process, the doped regions can be blurred with the undoped regions to create a linear graded doping profile.

Although FIGS. 1 through 8 have illustrated various example embodiments describing the principles of the present invention in this patent document, various changes may be made to FIGS. 1 through 8. For example, while certain materials (such as silicon, phosphorus, and p-type and n-type materials) have been described, this has been for illustration only. As a particular example, p-type and n-type materials can often be reversed. Also, the masks shown in FIGS. 5 through 7 are only examples of the various types of masks that could be used to produce a graded doping profile. In addition, while masks have been-used to describe the formation of particular structures (such as graded drift regions), the same or similar masks could be used to form any other suitable doped region having a graded doping profile.

It may be advantageous to set forth definitions of certain words and phrases that have been used within this patent document. The term "couple" and its derivatives refer to any direct or indirect communication between two or more components, whether or not those components are in physical contact with one another. The terms "include" and "comprise," as well as derivatives thereof, mean inclusion without limitation. The term "or" is inclusive, meaning and/or. The phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, have a relationship to or with, or the like.

While this disclosure has described certain embodiments and generally associated methods, alterations and permutations of these embodiments and methods will be apparent to those skilled in the art. Accordingly, the above description of example embodiments does not define or constrain this invention. Other changes, substitutions, and alterations are also possible without departing from the spirit and scope of this invention as defined by the following claims.

What is claimed is:

1. A semiconductor device comprising:
   a source region;
   a drain region;
   a channel region; and
   an extended drift region comprising a graded doping profile, wherein a doping concentration in the graded doping profile is lowest near the channel region and highest near the drain region.

2. The semiconductor device of claim 1, wherein the graded doping profile increases substantially linearly between the channel region and the drain region.

3. The semiconductor device of claim 1, wherein the graded doping profile varies in two dimensions.

4. The semiconductor device of claim 1, wherein the graded doping profile varies radially in two dimensions.

5. The semiconductor device of claim 1, wherein the source region, the drain region, the channel region, and the extended drift region are located within a semiconductor substrate; and
   further comprising a mask over the substrate, wherein the mask comprises a plurality of openings, wherein a two-dimensional size of the openings in at least a portion of the mask progressively increases along the mask as a spacing between the openings progressively decreases.

6. The semiconductor device of claim 5, wherein the mask comprises at least two regions containing different configurations of photo-resist material and openings, the photo-resist material and openings varying in two dimensions across the mask.

7. The semiconductor device of claim 6, wherein the at least two regions comprise:
   a first region comprising the openings in a layer of photo-resist material, the openings varying in size and spacing.

8. The semiconductor device of claim 7, wherein the at least two regions further comprise:
   a second region comprising blocks of the photo-resist material in an open region, the blocks varying in size and spacing.

9. The semiconductor device of claim 5, wherein the mask comprises a circular mask.

10. A semiconductor device comprising:
    a semiconductor substrate comprising a source region, a drain region, a channel region, and an extended drift region; and
    a mask over the substrate, wherein the mask comprises a plurality of openings, wherein a two-dimensional size of the openings in at least a portion of the mask progressively increases along the mask as a spacing between the openings progressively decreases;
    wherein the extended drift region comprises a graded doping profile with a lower doping level near the channel region and a higher doping level near the drain region.

11. The semiconductor device of claim 10, wherein the mask comprises at least two regions containing different configurations of photo-resist material and openings, the photo-resist material and openings varying in two dimensions across the mask.

12. The semiconductor device of claim 11, wherein the at least two regions comprise:
    a first region comprising the openings in a layer of photo-resist material, the openings varying in size and spacing.

13. The semiconductor device of claim 12, wherein the at least two regions further comprise:
    a second region comprising blocks of the photo-resist material in an open region, the blocks varying in size and spacing.

14. The semiconductor device of claim 10, wherein the mask comprises a circular mask.

15. The semiconductor device of claim 10, wherein the graded doping profile of the extended drift region varies in two dimensions.

16. A semiconductor device comprising:
    a semiconductor substrate comprising a source region, a drain region, a channel region, and an extended drift region; and
    a mask over the substrate, wherein the mask comprises:
       a first region comprising openings in a layer of photo-resist material, wherein a two-dimensional size of the openings in at least a portion of the first region progressively increases along the mask as a spacing between the openings progressively decreases; and
       a second region comprising blocks of the photo-resist material in an open region;
    wherein the extended drift region comprises a graded doping profile with a lower doping level near the channel region and a higher doping level near the drain region.

17. The semiconductor device of claim 16, wherein a two-dimensional size of the photo-resist blocks in at least a portion of the second region progressively increases along the mask as a spacing between the photo-resist blocks progressively decreases.

18. The semiconductor device of claim 16, wherein the mask comprises a circular mask.

19. The semiconductor device of claim 16, wherein the graded doping profile of the extended drift region varies in two dimensions.

20. The semiconductor device of claim 16, wherein the graded doping profile of the extended drift region varies radially in two dimensions.

* * * * *